US006797440B2

(12) United States Patent
Garza et al.

(10) Patent No.: US 6,797,440 B2
(45) Date of Patent: Sep. 28, 2004

(54) METHOD OF FORMING A RIM PHASE SHIFTING MASK AND USING THE RIM PHASE SHIFTING MASK TO FORM A SEMICONDUCTOR DEVICE

(75) Inventors: Cesar M. Garza, Round Rock, TX (US); Wei E. Wu, Austin, TX (US); Bernard J. Roman, Austin, TX (US); Pawitter J. S. Mangat, Gilbert, AZ (US); Kevin J. Nordquist, Higley, AZ (US); William J. Dauksher, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 151 days.

(21) Appl. No.: 10/213,344

(22) Filed: Aug. 6, 2002

(65) Prior Publication Data

US 2004/0029021 A1 Feb. 12, 2004

(51) Int. Cl.$^7$ .............................. G03F 9/00; G03C 5/00
(52) U.S. Cl. ........................................ 430/5; 430/394
(58) Field of Search ........................... 430/5, 322, 323, 430/324, 394

(56) References Cited

U.S. PATENT DOCUMENTS

| | | | |
|---|---|---|---|
| 5,126,006 A | | 6/1992 | Cronin et al. |
| 5,302,477 A | | 4/1994 | Dao et al. |
| 5,484,672 A | | 1/1996 | Bajuk et al. |
| 5,495,959 A | | 3/1996 | Rolfson |
| 5,536,606 A | | 7/1996 | Doan |
| 5,955,222 A | * | 9/1999 | Hibbs et al. .................. 430/5 |
| 6,007,324 A | | 12/1999 | Tzu et al. |
| 6,051,345 A | * | 4/2000 | Huang ........................... 430/5 |
| 6,224,724 B1 | | 5/2001 | Licata et al. |
| 6,333,129 B2 | * | 12/2001 | Kim et al. .................... 430/5 |
| 6,387,787 B1 | | 5/2002 | Mancini et al. |
| 6,582,856 B1 | * | 6/2003 | Quek et al. ................... 430/5 |

FOREIGN PATENT DOCUMENTS

| | | |
|---|---|---|
| EP | 0567419 A2 | 10/1993 |
| EP | 0595750 A1 | 5/1994 |

OTHER PUBLICATIONS

"Multi–Layer Resist Systems," (XP–002263495) Amerian Chemical Soc., ACS Symposium Series, vol. 219, 1983, pp. 311–314.
PCT/US03/15590 International Search Report.
Ishiwata et al, "Fabrication of Phase–Shifting Mask," SPIE vol. 1463 Optical/Laser Microlithography IV (1991), pp. 423–433.
Dauksher et al., "TaSiN Thin–Film Pattern Transfer Optimization for 200 mm SCALPEL and Extreme Ultraviolet Lithography Masks," J. Vac. Sci. Technol. B. 18(6), Nov/Dec. 2000, pp. 3232–3236.
Smith et al., "Cr Absorber Etch Process for Extreme Ultraviolet Lithography Mask Fabrication," J. Vac. Sci. Technol. B. 19(6), Nov/Dec 2001, pp. 2906–2910.
Bailey et al., "Template Fabrication Schemes for Step and Flash Imprint Lithography," Texas Materials Institute, University of Texas at Austin and Physical Sciences Research Laboratories, Motorola Labs, Tempe Arizona, pp. 1–19.

* cited by examiner

Primary Examiner—S. Rosasco
(74) Attorney, Agent, or Firm—Kim-Marie Vo; Joanna G. Chiu

(57) ABSTRACT

A semiconductor device is formed by patterning a resist layer using a rim phase shifting mask. A multilayer or single patterning layer to form the different phase-shifting regions and opaque regions is used to manufacture the rim phase shifting mask. First phase shifting regions are formed by transferring an opening in the multilayer or single patterning layer through an opaque layer and a transparent substrate. At least portions of the same multilayer or single patterning layer are used to recess the opaque layer a predetermined distance to form rims (second phase shifting regions). The first phase-shifting regions phase shift the light traveling through them 180 degrees relative to the light traveling through the rims, thereby increasing the contrast of the light traveling through the rim phase shifting mask.

22 Claims, 6 Drawing Sheets

METHOD OF FORMING A RIM PHASE SHIFTING MASK AND USING THE RIM PHASE SHIFTING MASK TO FORM A SEMICONDUCTOR DEVICE

FIELD OF THE INVENTION

The field of the invention relates generally to semiconductor devices and more specifically, to lithography.

RELATED ART

In an effort to fit more device functionality into smaller areas and to increase the speed of integrated circuits, the dimensions of features (e.g. widths of interconnect lines) in integrated circuits are shrinking. One obstacle to overcome is the reliability of forming a desired pattern with small features in a photoresist layer by shining radiation (e.g. light) through a reticle, a process termed optical lithography, at a reasonable cost. Since optical lithography is diffraction limited, the smallest feature that can be printed in the photoresist layer is constrained by the phenomena that as light travels through an opening in the reticle, the light spreads out (diffracts). If the diffracted light is not captured by the imaging optics, pattern information is lost and the small features cannot be constructed in the photoresist pattern. Since imaging optics inherently contain flaws, they cannot capture all of the pattern information. Thus, it is desirable to minimize diffraction.

One approach is optical phase shifting lithography, which uses a reticle with a patterned transparent material that has a predetermined thickness so light transmitted through the transparent material is 180 degrees out of phase with neighboring areas, which do not include the transparent material. The resultant interference effects improve the contrast, resolution and other process parameters of the pattern.

Many different approaches to optical phase shifting lithography are used to shift the phase of the light in predetermined portions of a reticle relative to other portions of the reticle in an effort to decrease diffraction and print small features. One type of mask is an alternating phase shifting mask (APSM), which has only 0 degree and 180 degree phase shifting regions. A major disadvantage of the APSM is that at the boundaries between the 0 degree and 180 degree phase shifting regions phase conflicts arise, which can lead to undesirable printing artifacts such as a line that is not part of the desired pattern.

Another optical lithography approach, a complementary phase shifting mask (CPSM) seeks to prevent the undesirable phase-conflict effects arising from the APSM by adding a second (non-phase shifting) mask, which is complementary to the first (phase shifting) mask. Although the phase conflict problem is solved, using the CPSM increases cycle time, cost and manufacturing complexity because two masks are used to form the desired pattern.

To overcome the disadvantages of APSM and CPSM, a rim phase shifting mask (RPSM) is used. A RPSM has rims located along edges of an opaque patterned region, which is usually chrome and is formed over a quartz substrate. The opaque patterned region blocks light so that a photoresist layer on a semiconductor wafer is not developed in areas underneath the opaque patterned region when using the RPSM in a lithographic process. Typically, the rims are trenches in the quartz substrate that shift the light 180 degrees relative to the quartz substrate to enhance the image contrast of the opaque patterned region, thereby improving resolution and process margin of the corresponding feature in photoresist on a semiconductor wafer.

One method to form the RPSM includes coating a photoresist layer over an unpatterned chrome layer that has been deposited over a planar quartz substrate. The first photoresist layer is patterned and used as a mask to first etch the chrome and then etch into the quartz to form the rims. It is important that the etching of the quartz is well controlled because the rims are extremely small (approximately 10–20% the size of the adjacent patterned chrome). After forming the rims, the first photoresist layer is removed and a second photoresist layer is coated over the chrome layer and patterned. The chrome layer is etched using the second photoresist pattern as a mask. The alignment of the second photoresist layer to the rims in the quartz substrate should allow remaining portions of the chrome layer to lie between the rims after the chrome has been etched back from the quartz rims. The above method also is problematic because two lithographic processes (i.e. photoresist patterning steps) are performed, which increases manufacturing time and cost. Therefore, a need exists for a controllable method to form a RPSM that self-aligns the rims to the patterned chrome and minimizes manufacturing time and cost.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In forming a semiconductor device, light travels through a reticle to pattern a resist (photoresist) layer on a semiconductor wafer. To improve the pattern on the resist layer the contrast of the light can be increased when incident on the resist by using a rim phase-shifting reticle or mask (RPSM). The RPSM can be formed using a multilayer or single layer mask film to pattern an opaque layer and a transparent substrate to form a first phase-shifting region and rims. In accordance with embodiments of the present invention, the rims do not phase shift light and are not etched into the quartz substrate. Instead, the first phase shifting region phase shifts the light traveling through it 180 degrees with respect to the rims and is formed by etching recesses or trenches into the transparent substrate. The rims are formed by recessing the opaque layer. Both the first phase shifting region and the rims are formed using portions of the multilayer or single layer mask film.

The first embodiment of the present invention is a method of forming a phase shifting mask using a bilayer mask film.

The top layer of the bilayer mask film patterns the transparent substrate and the bottom layer is recessed to etch the (underlying) opaque layer to form the rims. In a second embodiment, a three-layer mask film is used to form the RPSM. A top layer of the mask film is used to pattern a middle layer of the mask film, which in turn is used to pattern a bottom layer of the mask film and the opaque layer. The bottom layer is a mask for patterning the transparent substrate. In a third embodiment, the transparent substrate and the overlying opaque layer are etched using the same single photoresist layer. Each embodiment is better understood by turning to the figures.

Figure 1:
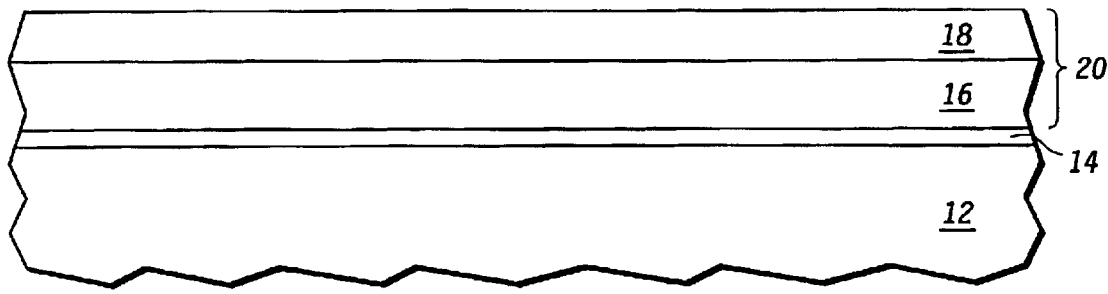
FIGS. 1–7 illustrate cross-sectional views of a rim phase shifting mask formed in accordance with a first embodiment of the present invention.

A method for forming a RPSM using the first embodiment is illustrated in FIGS. 1–7. Shown in FIG. 1 is a portion of a first reticle or RPSM 10 including a bilayer mask film 20 (e.g. a photoresist bilayer) formed over an opaque layer 14 (e.g. chrome or chromium) and a transparent substrate 12 (e.g. quartz). In one embodiment, the opaque layer 14, formed by physical vapor deposition (PVD), is approximately 100 nanometers (in thickness) of chrome. The bilayer mask film 20 includes a bottom (under or pattern) layer 16 and a top (image) layer 18. In one embodiment the bottom layer 16 and the top layer 18 are different resist layers. As will become apparent below, in the embodiment shown in FIGS. 1–7 when patterning or imaging the top layer 18, the bottom layer 16 should not be patterned. One way of achieving this is for the top layer 18 to have a higher sensitivity of exposure than the bottom layer 16 when the bilayer mask film 20 is exposed to a light or electron source for patterning. In a preferred embodiment, this will occur if the top layer is a silicon-containing resist layer, such as silane or silsequioxane, and the bottom layer 16 is a novolak-based material. However, the bottom layer 16 can be any polymer material (e.g. resist), organic material (e.g. polyimide or amorphous carbon), or any other material that will not be patterned when the top layer 18, which can be any polymer, organic material, or the like, is patterned.

Figure 2:
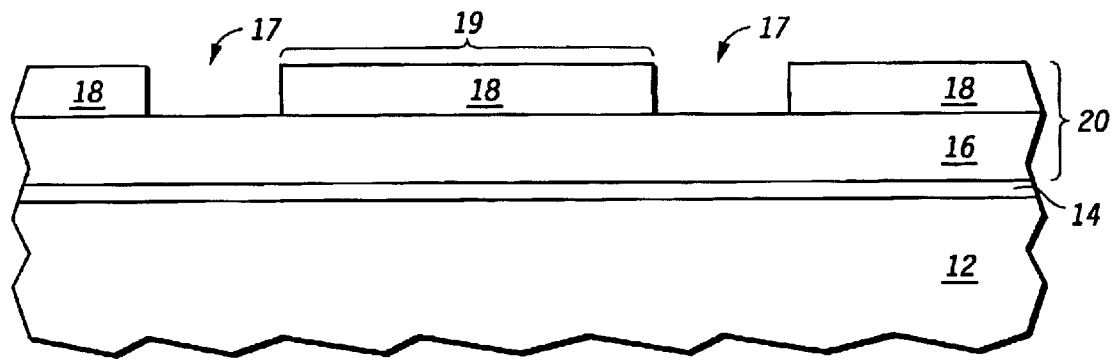

The top layer 18 is patterned, as shown in FIG. 2, using a known lithographic process, such as electron beam direct-write lithography (EBL), electron beam projection lithography (EPL), or any other optical lithography pattern generation technique, to expose the bottom layer 16 in a first opening 17. Although the first opening 17 in a cross-sectional view appears as two different openings in the embodiment shown in the figures, the first opening 17 from a top view is a rectangle that surrounds all sides of a patterned portion 19 of the top layer 18 and therefore will be referred to as a single opening. However, a skilled artisan should recognize that the first opening 17 need not form a rectangle from a top view and, instead, any other shape or design for patterning the top layer 18 can be used. The pattern used for the top layer 18 and the first opening 17 will depend on a desired pattern in a photoresist layer that is subsequently patterned as part of a process to form a semiconductor device, as will be explained in more detail below.

Figure 3:
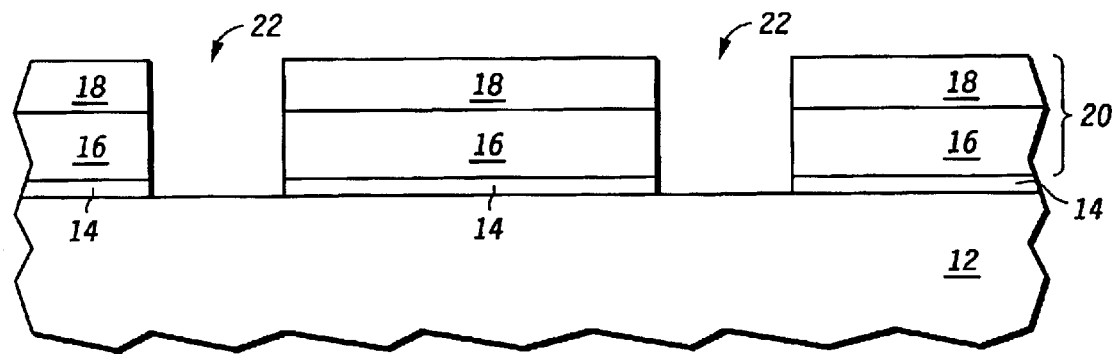

As shown in FIG. 3, after forming the first opening 17, the bottom layer 16 and the opaque layer 14 are etched to form a second opening 22, which is an extension into the bottom layer 16 and the opaque layer 14 of the first opening 17. In other words, the pattern of the top layer 18 is transferred to the bottom layer 16 and the opaque layer 14. In one embodiment, an oxygen chemistry is used to remove portions of the bottom layer 16, particularly, if the bottom layer 16 is a polymer material, such as resist, and a chemistry including chlorine and oxygen is used to remove portions of the opaque layer 14, if the opaque layer is a chromium-containing material, such as chrome. Since different chemistries are used to etch the bottom layer 16 and the opaque layer 14, the first opening 17 will be transferred first to the bottom layer 16 to form an opening and then the opaque layer 14 will be etched to complete the second opening 22. For simplicity, the resulting structure after etching the bottom layer 16 and the opaque layer 14 is shown in FIG. 3.

Figure 4:
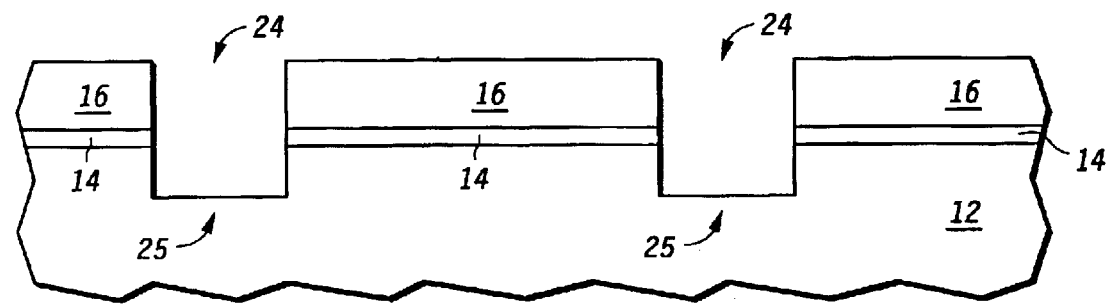

Once the second opening 22 is formed within the top layer 18, the bottom layer 16, and the opaque layer 14, portions of the transparent substrate 12 that are exposed by the second opening 22 are removed to form a third opening 24. Generally, remaining portion of the top layer 18 will be removed while etching the transparent substrate 12 because both the top layer 18 and the transparent substrate 12 will be able to be etched by the same chemistry. For example, if the transparent substrate 12 is quartz and the top layer 18 is silicon nitride, a fluorine-containing chemistry can be used to pattern the transparent substrate 12 and to remove the top layer 18. Thus, the bottom layer 16 is used as a mask for etching the transparent substrate 12. Since the bottom layer 16 was patterned using the top layer 18 as a mask, at this stage of the process, the bottom layer 16 will have substantially the same pattern that the top layer 18 had when originally exposed. (The patterns may slightly differ due to manufacturing and process variations that occur during etching of the bottom photoresist layer 16, for example.) The formation of the third opening 24 results in first phase-shifting regions 25 underneath the third opening 24, as shown in FIG. 4.

The first phase-shifting regions 25 are regions that shift the phase of radiation (e.g. light) that travels through them during a lithographic process. In a preferred embodiment, the first phase-shifting regions 25 are 180 degree phase shift regions, because they are thinner than the other regions of the transparent substrate 12. The thickness of the first phase shifting regions 25 is determined by the following equation:

$$d=\lambda/[2(n-1)],$$

wherein d is the thickness of the first phase shifting region 25, $\lambda$ is the wavelength of the radiation incident on the RPSM 10, and n is the index of refraction of the transparent substrate 12. The first phase shifting regions 25 cause the phase of the radiation traveling through these areas to be shifted 180 degrees relative to exposed unpatterned areas of the RPSM, which have not been formed yet at this stage of processing. In other words, no rims (second phase shifting regions) have been formed yet.

Figure 5:
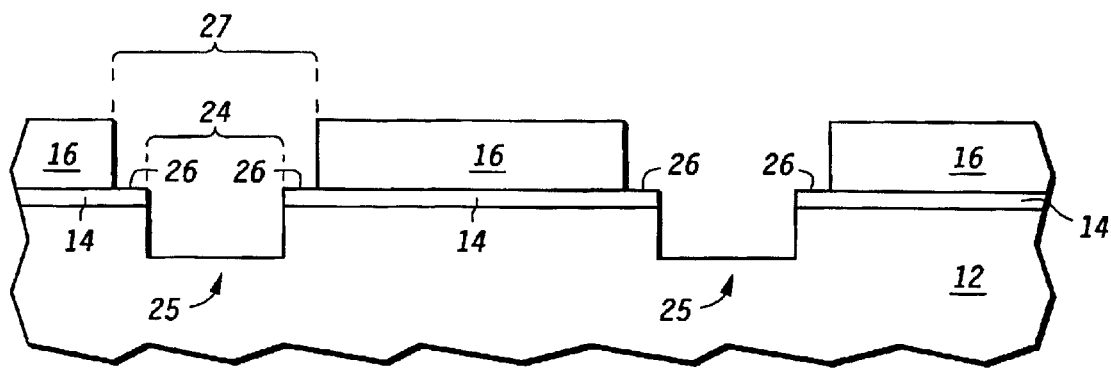

To form the rims, the bottom layer 16 is laterally recessed to enlarge a top portion of the third opening 24 to form a fourth opening 27 by exposing the bottom layer 16 to light in a lithographic process or isotropically etching the bottom layer 16 with an oxygen chemistry. (In addition, the thickness of the bottom layer 16 may decrease an amount equal to that of the amount of lateral recessing of the bottom layer 16 during the lateral recess process. Therefore, the thickness of the bottom layer 16 before lateral recessing should be thicker than the desired amount to be laterally recessed so that the entire bottom layer 16 is not removed during this pattern process.) Thus, the boundaries (outer edges) of the fourth opening 27 extend beyond the boundaries of the third opening 24. In other words, the width of the fourth opening 27 is greater than the width of the third opening 24. Additionally, the fourth opening 27 is concentric with the third opening 24. By laterally recessing the bottom layer 16, a portion of the opaque layer 14 is exposed. As shown in FIG. 5, the amount of recessing of the bottom layer 16 is equivalent to the amount of the opaque layer 14 that is exposed because the edges the bottom layer 16 and the opaque layer 14 were substantially coplanar prior to recessing the bottom layer 16.

Figure 6:
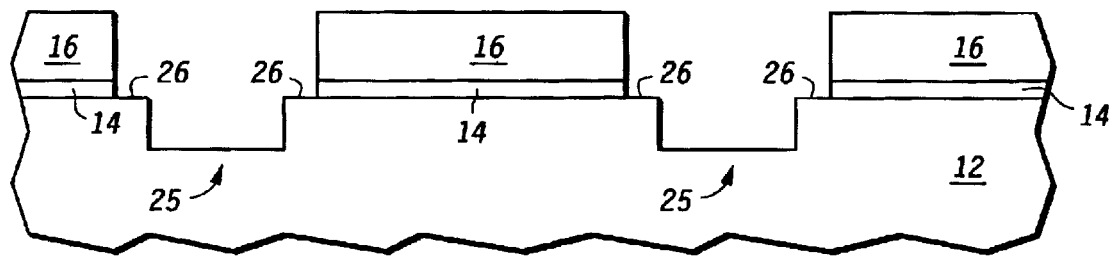

As shown in FIG. 6, after forming the fourth opening 27, the exposed portions of the opaque layer 14 are removed (recessed). If the opaque layer 14 is a chromium-containing material, a chemistry including chlorine and oxygen may be used. The opaque layer 14 is recessed so that afterwards the edges of the opaque layer 14 and the underlying layer 16 are substantially coplanar again. Portions of the transparent layer 12 that are exposed as a result of recessing the opaque layer 14 are the rims 26 (second phase shifting regions or mesa regions) 26, which in a preferred embodiment do not substantially shift the phase of the light that travels through it. The light is not phase-shifted because the thickness of the second phase shifting regions 26 is approximately equal to K times the wavelength of light divided by the index of refraction, where K is a whole number. The difference in phase between the light from the first phase shifting regions 25 and the rims 26 is 180 degrees. Thus, in an alternate embodiment, the rims 26 are second phase shifting regions and phase shift the light 270 degrees, whereas, the first phase shifting regions 25 phase shift the light 90 degrees. As shown in FIG. 6, the rims 26 are edges that are adjacent and on either side of the first phase shifting regions 25. The regions covered by the opaque layer 14 that are adjacent the rims 16 are field regions 28.

After forming the rims 26, the bottom layer 16 is removed, in one embodiment using an ash process, which is an etch process using an oxygen plasma. After the bottom layer 16 is removed, the first reticle 10 or more specifically, a first phase shifting mask, is complete and illustrated in FIG. 7. As will become apparent below, the opaque layer 14 formed over the field regions 28 substantially blocks the radiation that is incident on the first reticle 10, the first phase-shifting regions 25 shift the phase of the light 180 degrees relative to the rims 26, and the rims 26 transmit the radiation through the transparent substrate 12 without phase shifting the light to pattern a small features in a resist layer formed over a semiconductor substrate.

Figure 8:
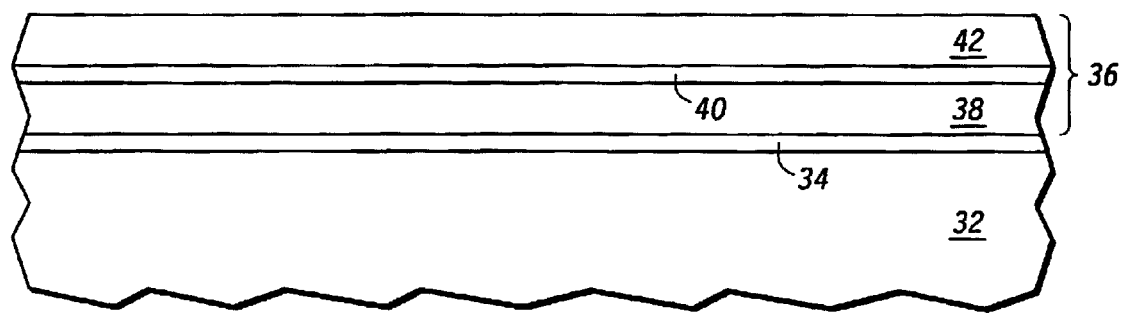
FIGS. 8–13 illustrate cross-sectional views of a rim phase shifting mask formed in accordance with a second embodiment of the present invention.

FIGS. 8–13 illustrate a second embodiment for forming a phase shifting mask in accordance with the present invention. The second reticle 30 includes a transparent substrate 32 and an opaque layer 34 that are analogous to the equivalent layers of the first reticle 10 (e.g. the transparent substrate 12 and the opaque layer 14). A trilayer stack 36 including a bottom (mask) layer 38, a middle (hardmask) layer 40 and a top (mask) layer 42 is formed over the opaque layer 34, as shown in FIG. 8. The bottom layer 38 and the top layer 42 may be the same materials, such as a resist (e.g. novolak-based material). However, the bottom layer 38 and the top layer 42, in one embodiment, are different materials (e.g. the bottom layer 38 is a novolak-based material and the top layer 42 is a silicon-containing resist layer). The middle layer 40 can be a resist layer or an oxide layer, such as HSQ (hydrogen silsequioxane) or silicon oxide ($SiO_2$). The material chosen for the middle layer 40 should be able to be selectively exposed or etched with respect to both the top layer 42 and the bottom layer 38. In one embodiment, the thickness for these layers vary from 50 to 300 nanometers. More specifically, the thickness of the top layer 42 is approximately equal to 50 nanometers, the thickness of the bottom layer 38 is about 300 nanometers, and the thickness of the middle layer 40 is between approximately 50 to 300 nanometers.

Figure 9:
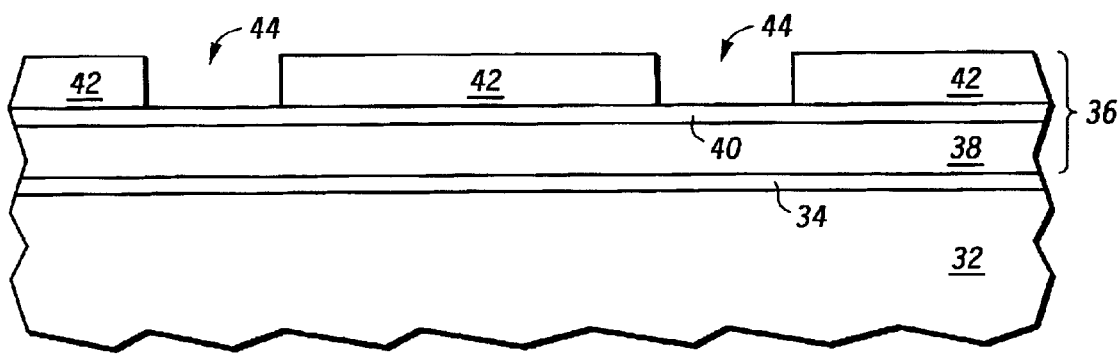

The top layer 42 is patterned, as shown in FIG. 9, using a known lithographic process to form a first opening 44, which exposes portions of the middle layer 40. The first opening 44, like the first opening 17 of the first embodiment, is actually one opening although it appears in cross-sectional view as two openings.

Figure 10:
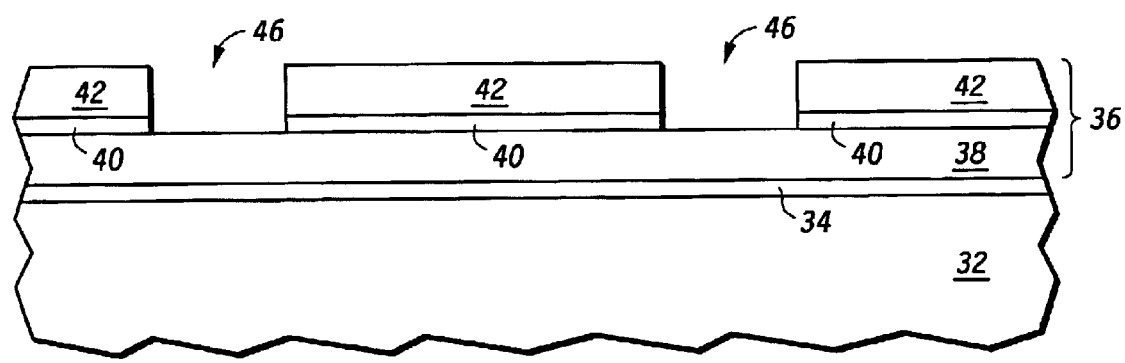

As shown in FIG. 10, after forming the first opening 44, the middle layer 40 is etched to form a second opening 46, which is an extension into the middle layer 40 of the first opening 44. In the embodiment where the middle layer 40 is silicon oxide and the bottom layer 38 is resist, a fluorocarbon-containing chemistry can be used to etch the middle layer 40 selective to the bottom layer 38.

Figure 11:
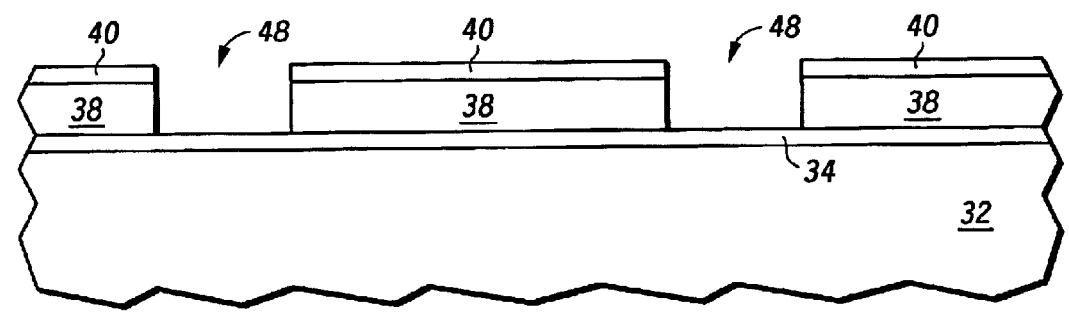

After forming the second opening 46, the bottom layer 38 is etched to form a third opening 48, which is an extension into the bottom layer 38 of the second opening 46, as illustrated in FIG. 11. If the top layer 42 is the same material as the bottom layer 38, then at least portions of the top layer 42 will be removed while patterning the bottom layer 38 because the top layer 42 is exposed to a chemistry that etches itself while the bottom layer 38 is etched. For the entire top layer 42 to be removed when patterning the bottom layer 38, the top layer 42 should be less than or equal to the thickness of the bottom layer 38. In a preferred embodiment, the top layer 42 is significantly thinner than the bottom layer 38 to ensure that all of the top layer 42 is removed while patterning the bottom layer 38. Thus, an additional processing step to remove the top layer 42 need not be performed. If the top layer 42 is removed during patterning of the bottom layer 38, the middle layer 40 should not be removed (i.e. the etch chemistry should be selective to the middle layer 40) so that the middle layer 40 can be used as a mask for patterning the bottom layer 38.

In another embodiment, provided the top layer 42 and the middle layer 40 are used together as a mask for patterning the bottom layer 38, the top layer 42 is not removed while patterning the bottom layer 38. However, if the top layer 42 can serve as a mask for patterning the bottom layer 38, then the middle layer 40 is not necessary and instead of the trilayer stack 36, a bilayer stack as illustrated in the first method should be used to minimize processing (e.g. deposition of the middle layer 40) and, thus, decrease manufacturing cycle time.

Figure 12:
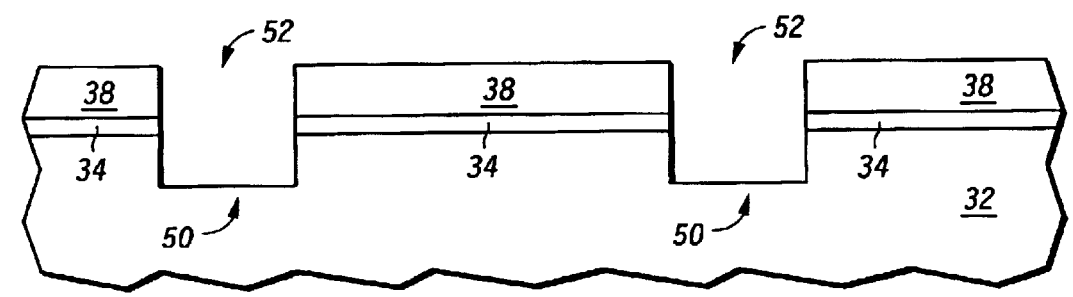

As shown in FIG. 12, after patterning the bottom layer 38, the opaque layer 34 and the transparent substrate 32 are etched to form a fourth opening 52, which is an extension of the previous openings into the opaque layer 34 and the transparent substrate 32. The chemistries previously mentioned for etching the opaque layer 14 and the transparent substrate 12 in the first embodiment can be used to etch the transparent substrate 32 and the opaque layer 34, since the materials may be the same. Generally, the middle layer 40 will be removed while etching the transparent substrate 32, so the bottom layer 38 serves as the mask for etching the transparent substrate 32. Under the fourth opening 52 are the first phase shifting regions 50, which are analogous to the first phase shifting regions 25 of the first reticle 10.

Figure 7:
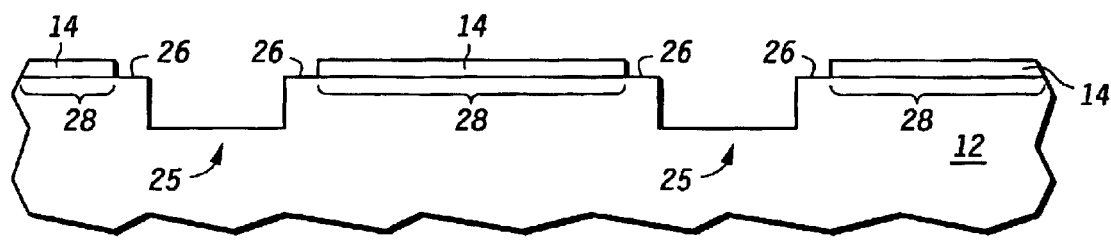
Figure 13:
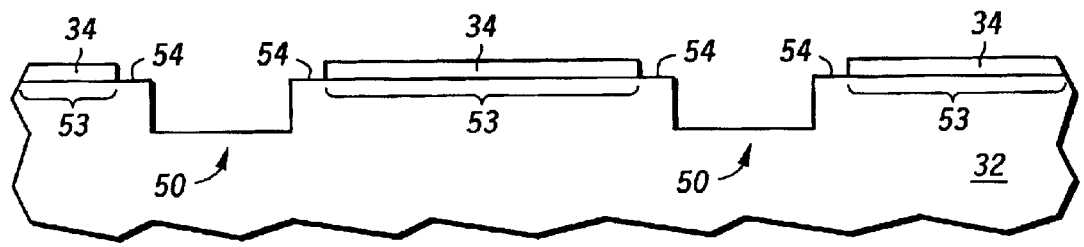
Figure 14:
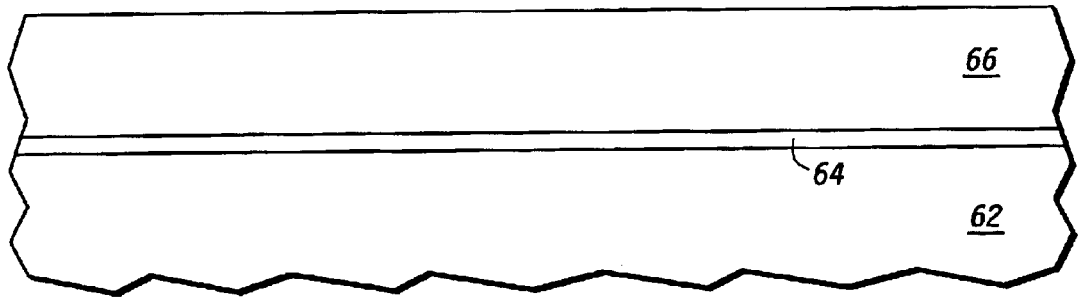
FIGS. 14–19 illustrate cross-sectional views of a rim phase shifting mask formed in accordance with yet another embodiment of the present invention.

Processing to finish manufacturing the second reticle 30 is the same as the processing described in regards to FIGS. 5–7 of the first embodiment. After forming the first phase-shifting regions 50, the bottom layer 38 is recessed to enlarge a top portion of the fourth opening 52 so the top portion (a fifth opening, not shown) has boundaries that extend beyond boundaries of the fourth opening and portions of the opaque layer 34. The exposed portions of the opaque layer 34 are subsequently removed to form rims (second phase shifting regions) 54, as shown in FIG. 13. Afterwards, the bottom layer 38 is removed, which in one embodiment is performed by an ash process. The resulting second reticle (second phase shifting mask) 30 has field regions 53 which are under the opaque layer 34, first phase shifting regions 50 and rims 54, which are analogous to the equivalent regions of the first reticle and are all used together to pattern a layer on a semiconductor wafer, as will be explained in detail below.

FIGS. 14–19 illustrate a third method to form a phase shifting mask in accordance with the present invention. The third reticle 60 in FIG. 14 includes a resist layer 66 overlying an opaque layer 64, which is formed over a transparent substrate 62. In one embodiment, the opaque layer 64 is 100 nanometers (in thickness) of chrome formed by PVD and the resist layer is at least approximately 500 nanometers, or more specifically approximately 500 to 700 nanometers of resist formed by spin coating techniques. The transparent substrate 62 and the opaque layer 64 are similar to the equivalent layers in the previous embodiments.

Figure 15:
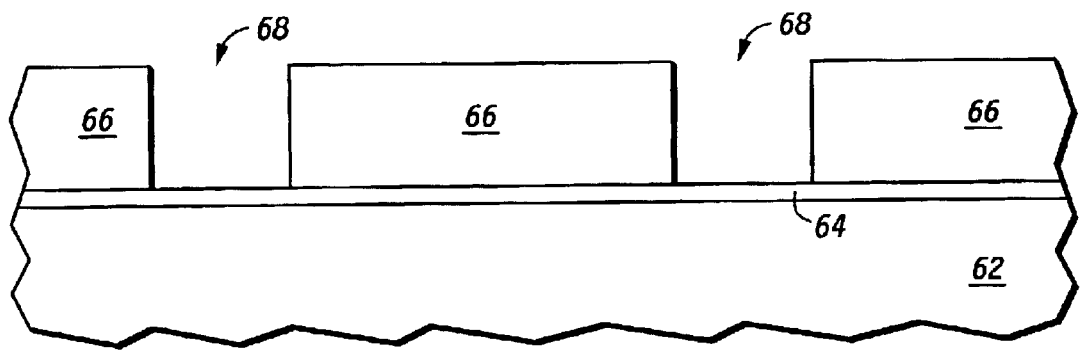

As shown in FIG. 15, the resist layer 66 is patterned to form a first opening 68, which extends through the resist layer 66 and exposes the opaque layer 64. Any conventional lithographic process can be used to form the first opening 68. The first opening 68, which is analogous to the first openings in the previous embodiments, is one opening although when viewed in cross-section, it appears as two openings. After patterning the resist layer to form the first opening 68, no additional resist layer is formed over the transparent substrate 62 for subsequent patterning.

Figure 16:
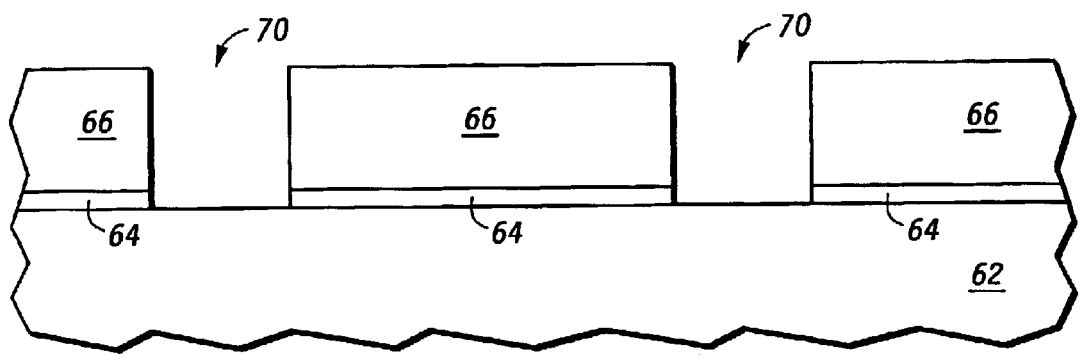

After forming the first opening 68, the opaque layer 64 within the first opening 68 is removed to form a second opening 70, which extends through the resist layer 66 and the opaque layer 64, as shown in FIG. 16. A chlorine-containing and oxygen-containing chemistry may be used to etch the opaque layer 64 if it is chrome.

Figure 17:
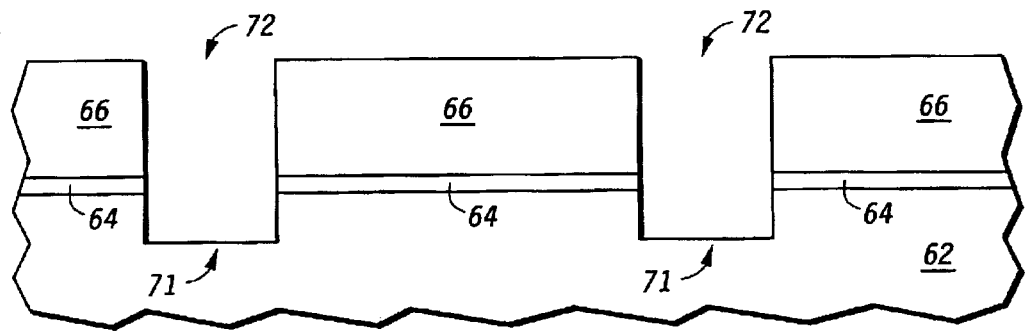
Figure 18:
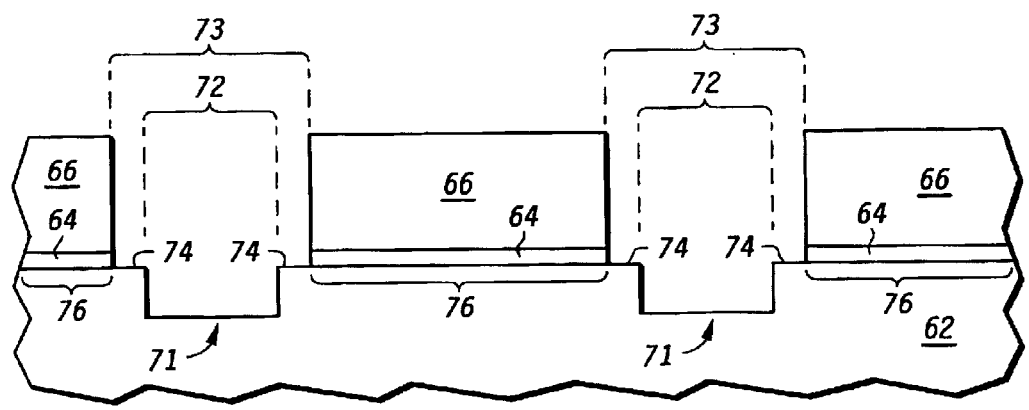
Figure 19:
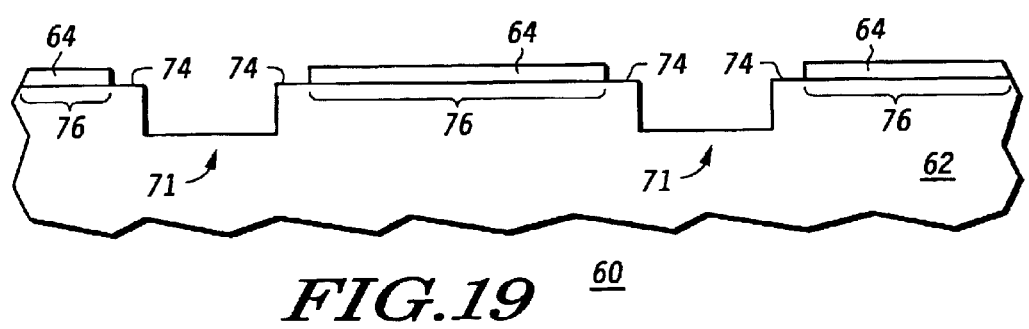

As shown in FIG. 17, the second opening 70 is extended into the transparent substrate 62 by etching recesses (trenches) into the transparent substrate 62 using a fluorine-containing chemistry, in one embodiment, to form a third opening 72. By thinning portions of the transparent substrate 62, first phase-shifting regions 71 are formed, which are analogous to the first phase-shifting regions formed in the previous embodiments. In other words, the first phase-shifting regions 71 are 180 degree phase-shifting regions.

After forming the first phase-shifting regions 71, the resist layer 66 and the opaque layer 64 are simultaneously recessed to together form a fourth opening 73, which is concentric with and has boundaries that extend beyond the boundaries of the third opening 72. The exposed portions of the transparent substrate 72 that are not within the trenches are rims 74, which are the zero phase-shifting regions of the third mask 60. The rims 74 are adjacent to the opaque layer 64, which overlies field regions 76.

In the third embodiment, a single resist layer 66 (i.e. not a multilayer stack) is used to form the first phase-shifting regions 71 and rims 74. Since significant portions of a resist layer will remain throughout the patterning process, an appropriate resist layer is needed. Preferably, the resist layer is greater than approximately 500 nanometers or more preferably is between approximately 500 and 700 nanometers. Thus, in one embodiment, a thick resist layer can be used. In prior art methods, thick resist layers are not used to pattern small dimensions, such as rims, because of the limitations of processes to controllably pattern the resist to form small features. However, Applicants have overcome this problem by determining a chemistry and other etch parameters to allow for rims to be controllably formed using a single resist layer.

In one embodiment, if the opaque layer 64 is chrome, an etch process with a 7:1 to 1:1 or more specifically, approximately 7:1 or approximately 5:1 ratio of chlorine to oxygen may be used to recess the chrome. This chemistry also recesses the single thick resist layer 66. The degree to which the single thick resist layer 66 is recessed depends upon selectivity to the single thick resist layer 66 of the chemistry used to recess the chrome. In a preferred embodiment, the recess amount of the chrome and of the resist is approximately equal. In this embodiment, 1 to 200 sccm of chlorine and 1 to 200 sccm of oxygen are used as the etching chemistry. Additional gases may be added to the chorine and oxygen such as argon. In one embodiment, the source power may be at least approximately 200 Watts and the RF (radio frequency) bias power applied to the chamber may be less than or equal to approximately 300 Watts. The pressure used in one embodiment is between 1 to 300 millitorr (mT) or more specifically, between 1 to 100 mT. In a preferred embodiment, a flow of 35 sccm (standard cubic centimeters) of chlorine and 9 sccm of oxygen are used as the etching chemistry with the following parameters for a reactive ion etching (RIE) tool: a pressure of 10 mT, 15 W of RF power, and 500 W of source power. A skilled artisan should appreciate that the conditions, especially the powers and pressure used, may vary for different tools. After forming the rims 74, the thick single resist layer 66 is removed, resulting in the third reticle (phase shifting mask) 60, which is equivalent in operation to the resulting phase shifting masks formed by the previous embodiments.

Figure 20:
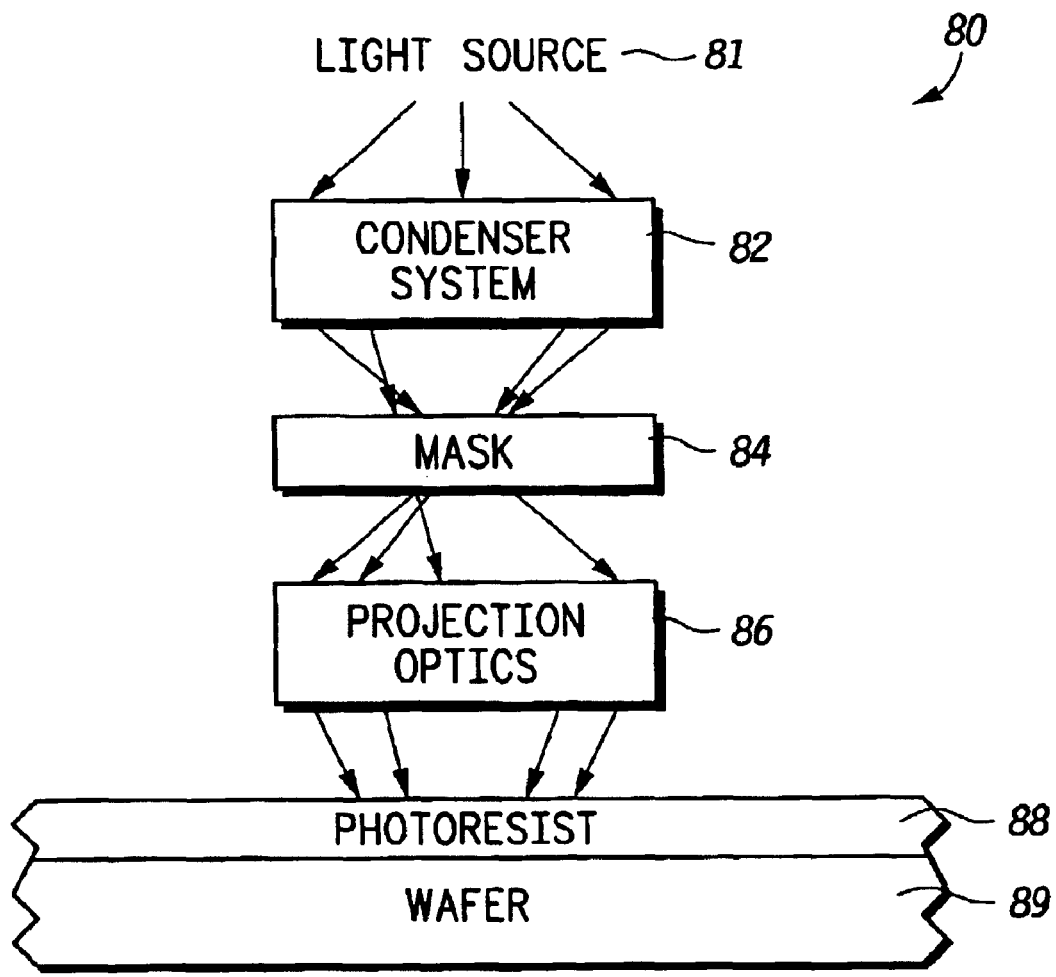
FIG. 20 illustrates a method of using any of the rim phase shifting masks formed in the various embodiments illustrated in FIGS. 1–19 to pattern a photoresist layer formed over a semiconductor wafer.

The first reticle 10, the second reticle 30 and the third reticle 60 can be used to pattern a layer (e.g. a resist layer) on a semiconductor device. Shown in FIG. 20 is an apparatus 80 that can be utilized in exposing a mask 84, which can be the first reticle 10, the second reticle 30 or the third reticle 60. The apparatus 80 includes a light source 81, a condenser system 82, the mask 84, projection optics 86, and a wafer 89 having a resist layer 88 overlying it. The condenser system 82 receives light generated form the light source 81 and applies it to all of the mask 84 that has a pattern to be applied to the wafer 89. The field regions of the mask 84 block the light received from the condenser system 82 and therefore light travels through only the first phase-shifting regions and the rims (i.e., the first phase shifting regions 25, 50, and 71 and the rims 26, 54 and 74 of the reticles 10, 30, and 50, respectively.) The light that travels through the first phase-shifting regions are phase shifted 180 degrees with respect to the light that travels through the rims so that the light from the first phase-shifting regions and the rims can destructively interfere with each other. This destructive interference of any overlapping light from the first phase-shifting regions and rims will increase the contrast between areas of the resist 88 on the wafer 89 that will be exposed using the mask 84. After the light travels through portions of the mask 84 and is blocked by other portions of the mask 84, the projection optics 86 focuses passing the light onto the resist 88 so that the resist 88 is selectively exposed according to the pattern present on the mask 84.

In all the embodiments, the same resist layer (multilayer or single layer) is used to form the first phase-shifting regions and rims. By using the same resist layer, multiple time-consuming and costly lithographic processes are eliminated, thereby decreasing cycle time and manufacturing costs. Another advantage of using any of the embodiments described is that a self-aligned process is used to align the rims to the first phase shifting regions and field regions, therefore eliminating the chance of misalignment. By decreasing the chances of misalignment, a more robust process is achieved which should increase yield. Also, in accordance with the embodiments described above, all etching can be performed in the same system to reduce handling, thereby reducing cost and defect generation. Some of the above methods also allow for variable sized rims to be manufactured with good uniformity. In other words, all the rims need not be the same size. For example, to form rims of different sizes, the multilayer or single layer mask film would need to be patterned appropriately. In other words, the patterns of the rims in the multilayer or single layer mask film would have different sizes.

Although not shown, any exposed layer (e.g. a resist layer) may decrease in thickness when etching an underlying layer. For example, in the third embodiment, the resist layer 66 may decrease in thickness when etching the transparent substrate 62 to form the first phase-shifting regions 71 in FIG. 17. In an embodiment, the resist thickness may decrease by about 5–10% of the original thickness.

Additional processes than those described above may be performed. For example, after forming any opening described above in any resist layer (multilayer or single layer), a descum process may be performed using an oxygen plasma to refine the opening and to remove any resist residue created from the resist layer patterning process.

In addition, the opaque layer may be damaged when patterning to form rims. To avoid such damage, the resist layer (multilayer or single layer) may be patterned using backside exposure prior to recessing the opaque layer to form rims. This is most likely to be used in conjunction with the third embodiment.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a rim phase shifting mask comprising:
    providing a transparent substrate;
    forming an opaque layer overlying the transparent substrate;
    forming a first masking layer overlying the opaque layer;
    forming a second masking layer overlying the first masking layer;
    patterning the second masking layer to define a first opening;
    transferring the first opening through the second masking layer and the opaque layer, and into the transparent substrate to expose a first phase-shifting region of the transparent substrate;
    recessing the first masking layer to form a second opening, an outer edge of the second opening extending beyond an outer edge of the first opening;
    removing portions of the opaque layer overlying the transparent substrate within the second opening to expose a rim region of the transparent substrate; and
    removing the first and second masking layers to form the rim phase shifting mask.

2. The method of claim 1, wherein the transparent substrate comprises quartz.

3. The method of claim 2, wherein the opaque layer comprises chromium.

4. The method of claim 1, wherein the first masking layer comprises a novolak based material.

5. The method of claim 4, wherein the second masking layer comprises a silicon-containing material.

6. The method of claim 1, wherein the first phase-shifting region phase shifts light one hundred and eighty degrees out of phase with respect to radiation passing through the rim region.

7. The method of claim 1, wherein the second opening is concentric with the first opening.

8. The method of claim 1, further comprising:
    forming a third masking layer overlying the first masking layer, wherein the second masking layer overlies the third masking layer.

9. The method of claim 8, wherein forming the first opening comprises:
    transferring the first opening through the third masking layer,
    using the third masking layer to form the first opening through the first masking layer and the opaque layer, and
    removing the third masking layer.

10. The method of claim 9, wherein the first masking layer and the second masking layer each comprise a resist material and the third masking layer comprises a hardmask.

11. The method of claim 9, wherein the third masking layer is removed while transferring the first opening through the opaque layer.

12. The method of claim 9, wherein the second masking layer is removed while transferring the first opening through the first masking layer.

13. A method of forming a rim phase shifting mask comprising:
    providing a transparent substrate;
    forming an opaque layer overlying the transparent substrate;
    forming a resist layer overlying the opaque layer, wherein forming the resist layer is performed such that the resist layer has a thickness of at least approximately 500 nanometers;
    patterning the resist layer to define a first opening;
    transferring the first opening through the opaque layer and into the transparent substrate to expose a first phase-shifting region of the transparent substrate;
    recessing portions of the opaque layer overlying the transparent substrate and underlying the resist layer;
    recessing portions of the resist layer while recessing portions of the opaque layer, and
    removing the resist layer after recessing portions of the opaque layer to form the rim phase shifting mask.

14. The method of claim 13 wherein no additional resist layer is formed after pattering the resist layer to define the first opening and prior to removing the resist layer.

15. The method of claim 13, wherein recessing portions of the opaque layer further comprises etching the opaque layer using a source power of at least approximately 200 Watts.

16. The method of claim 15, wherein etching the opaque layer uses an RF bias power of almost approximately 300 Watts.

17. The method of claim 16, wherein etching the opaque layer uses a chlorine to oxygen ratio of approximately 7 to 1.

18. The method of claim 16, wherein etching the opaque layer uses a chlorine to oxygen ratio of approximately 5 to 1.

19. The method of claim 13, wherein recessing portions of the opaque layer comprises anisotropically etching the opaque layer.

20. The method of claim 13, wherein the resist layer is used as a mask while forming the first opening.

21. The method of claim 13, wherein the portions of the opaque layer are recessed a first distance and the portions of the resist layer are recessed a second distance; and the first distance and the second distance are approximately equal to each other.

22. A method for forming a semiconductor device:

providing a semiconductor substrate;

forming a resist layer over the semiconductor substrate;

providing a rim phase shifting mask formed by a method comprising:

providing a transparent substrate;

forming an opaque layer overlying the transparent substrate;

forming a first masking layer overlying the opaque layer;

forming a second masking layer overlying the first masking layer;

patterning the second masking layer to define a first opening;

transferring the first opening through the second masking layer and the opaque layer, and into the transparent substrate to expose a first phase-shifting region of the transparent substrate;

recessing the first masking layer to form a second opening, an outer edge of the second opening extending beyond an outer edge of the first opening;

removing portions of the opaque layer overlying the transparent substrate within the second opening to expose a rim region of the transparent substrate; and removing the first and second masking layers to form the rim phase shifting mask; and providing a radiation source through the rim phase shifting mask to the semiconductor substrate to form an exposed pattern on the resist layer.

* * * * *

UNITED STATES PATENT AND TRADEMARK OFFICE
CERTIFICATE OF CORRECTION

PATENT NO. : 6,797,440 B2 Page 1 of 1
DATED : September 28, 2004
INVENTOR(S) : Cesar Garza et al.

It is certified that error appears in the above-identified patent and that said Letters Patent is hereby corrected as shown below:

Column 11,
Line 2, change "of almost" to -- of at most --.

Signed and Sealed this

Third Day of January, 2006

JON W. DUDAS
*Director of the United States Patent and Trademark Office*